(12) United States Patent
Hainz (10) Patent No.: US 11,079,447 B2
(45) Date of Patent: *Aug. 3, 2021

(54) MAGNETIC SENSOR WITH AN ASYMMETRIC WHEATSTONE BRIDGE

(71) Applicant: Infineon Technologies AG, Neubiberg (DE)

(72) Inventor: Simon Hainz, Villach (AT)

(73) Assignee: Infineon Technologies AG

( * ) Notice: Subject to any disclaimer, the term of this patent is extended or adjusted under 35 U.S.C. 154(b) by 0 days.

This patent is subject to a terminal disclaimer.

(21) Appl. No.: 17/007,164

(22) Filed: Aug. 31, 2020

(65) Prior Publication Data

US 2020/0400760 A1    Dec. 24, 2020

Related U.S. Application Data

(63) Continuation of application No. 15/972,437, filed on May 7, 2018, now Pat. No. 10,761,153.

(51) Int. Cl.
*G01R 33/09* (2006.01)
*H01F 7/02* (2006.01)

(52) U.S. Cl.
CPC ......... *G01R 33/093* (2013.01); *G01R 33/091* (2013.01); *H01F 7/0273* (2013.01)

(58) Field of Classification Search
CPC .. G01R 33/09; G01R 33/0041; G01R 15/185; G01R 15/20; G01R 33/093; G01R 33/091; H01F 7/70273
See application file for complete search history.

(56) References Cited

U.S. PATENT DOCUMENTS 10,761,153 B2 *  9/2020  Hainz .................. G01R 33/091
2017/0276740 A1 *  9/2017  Schmitt ............... G01R 33/091

* cited by examiner

*Primary Examiner* — Alesa Allgood
(74) *Attorney, Agent, or Firm* — Design IP (57) ABSTRACT

Magnetic sensors, sensor modules, and methods thereof are provided. A magnetic sensor includes a sensor arrangement including a plurality of magnetic field sensor elements electrically arranged in an asymmetrical bridge circuit, where a first total resistance of a first pair of sensor elements provided on a first side of the asymmetrical bridge circuit is different from a second total resistance of a second pair of sensor elements provided on a second side of the asymmetrical bridge circuit, and the asymmetrical bridge circuit is configured to generate a differential signal based on sensor signals generated by the plurality of magnetic field sensor elements in response to a magnetic field impinging thereon.

12 Claims, 6 Drawing Sheets

MAGNETIC SENSOR WITH AN ASYMMETRIC WHEATSTONE BRIDGE

CROSS-REFERENCE TO RELATED APPLICATIONS

This application is a continuation of U.S. patent application Ser. No. 15/972,437 filed May 7, 2018, which is incorporated by reference as if fully set forth.

FIELD

The present disclosure relates generally magnetic sensors, and, more particularly, to a magnetic sensor with an asymmetric Wheatstone bridge.

BACKGROUND

In the field of speed sensing, a sinusoidal-like signal may be generated by a magnetic sensor in response to a rotation of a target object, such as a wheel, camshaft, crankshaft, or the like. For example, a back bias magnet may be used to produce a magnetic field, and a magnetic speed sensor may be placed between the target object and the back bias magnet. The sinusoidal signal may be generated and translated into pulses, which is further translated into a movement detection or a speed output.

One or more sensor arrangements may be used in a Wheatstone bridge configuration. However, in back bias applications, when a magnetic sensor is placed between a toothed wheel and a magnet, the magnetic field of a standard low cost magnet generates a large static magnetic field to the left side and the right side of the bridge. This large static magnetic field results in a large electrical direct current (DC) offset at the output voltage of the Wheatstone bridge. The electrical DC offset must be compensated by an offset compensation digital-to-analog converter (DAC) or similar solution. A drawback using the offset compensation DAC is that additional noise is introduced into the signal path. This is especially the case if a ratio between the offset and the signal is large, as is usually the case. Then, the offset compensation DAC must be optimized for noise which requires very large chip area.

SUMMARY

Magnetic sensors, sensor modules, and methods thereof are provided.

According to one or more embodiments, a magnetic sensor includes a sensor arrangement including a plurality of magnetic field sensor elements electrically arranged in an asymmetrical bridge circuit, where a first total resistance of a first pair of sensor elements provided on a first side of the asymmetrical bridge circuit is different from a second total resistance of a second pair of sensor elements provided on a second side of the asymmetrical bridge circuit, and the asymmetrical bridge circuit is configured to generate a differential signal based on sensor signals generated by the plurality of magnetic field sensor elements in response to a magnetic field impinging thereon.

According to one or more embodiments, a magnetic sensor module includes a magnet having a magnetic operation point (MOP) and configured to produce a differential magnetic field, the differential magnetic field having a differential MOP field strength at the MOP, and further having a first differential field portion and a second differential field portion. The magnetic sensor module further includes an asymmetric bridge circuit including a plurality of magnetic field sensor elements, including a first pair of sensor elements disposed in the first differential field portion and a second pair of sensor elements disposed in the second differential field portion, where the asymmetric bridge circuit is configured to generate a differential signal based on sensor signals generated by the plurality of magnetic field sensor elements, and the differential signal is zero on a condition that a differential field strength of the differential magnetic field impinging on the plurality of magnetic field sensor elements is equivalent to the differential MOP field strength.

BRIEF DESCRIPTION OF THE DRAWINGS

Embodiments are described herein making reference to the appended drawings.

DETAILED DESCRIPTION

In the following, various embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided. In addition, features of the different embodiments described hereinafter may be combined with each other to form further embodiments, unless specifically noted otherwise. For example, variations or modifications described with respect to one of the embodiments may also be applicable to other embodiments unless noted to the contrary.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. Functional blocks may be implemented in hardware, firmware, software, or a combination thereof.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor", "sensor element", and "sensing element" may be used interchangeably throughout this description, and the terms "sensor signal" and "measurement signal" may also be used interchangeably throughout this description.

Magnetic sensors, as provided herein, may be magnetoresistive sensors. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current and direction of magnetization is observed. For example, in the case of AMR sensors, a resistance for an AMR sensor element changes according to a square of a sine of an angle of the magnetic field component projected on a sensing axis of the ARM sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction). The reference magnetization is a magnetization direction that provides a sensing direction corresponding to a sensing axis of the xMR sensor. Accordingly, if a magnetic field component points exactly in the same direction as the reference direction, a resistance of the xMR sensor element is at a maximum, and, if a magnetic field component points exactly in the opposite direction as the reference direction, the resistance of the xMR sensor element is at a minimum. A magnetic field component may be, for example, an x-magnetic field component (Bx), a y-magnetic field component (By), or a z-magnetic field component (Bz), where the Bx and By field components are in-plane to the magnetic sensor, and Bz is out-of-plane to the magnetic sensor.

In some applications, an xMR sensor includes a plurality of magnetoresistive sensor elements, which have different reference magnetizations. Examples of such applications, in which various reference magnetizations are used, are angle sensors, compass sensors, or specific types of speed sensors (e.g., speed sensors in a bridge arrangement).

By way of example, such magnetoresistive sensor elements are used in speed, angle or rotational speed measuring apparatuses, in which magnets may be moved relative to an magnetoresistive sensor elements and hence the magnetic field at the location of the magnetoresistive sensor element changes in the case of movement, which, in turn, leads to a measurable change in resistance.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package. The sensor package may be combined with a back bias magnet to form a sensor module, sensor device, or the like.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. Therefore, the sensor package may include a circuit that conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Embodiments herein may employ one or more Wheatstone bridge circuits. As used herein, "bridge circuit," "bridge device," and "bridge" may be used interchangeably. A bridge circuit is a topology of electrical circuit in which two circuit branches or legs (usually in parallel with each other) are "bridged" by a third branch connected between the first two branches at some intermediate point along them. A bridge circuit may include passive elements, such as resistive, capacitive, and inductive elements, or a combination thereof.

Magnetoresistive sensor elements of an xMR sensor are resistive elements that may be arranged in a bridge configuration. This bridge circuit of xMR sensors may convert a differential magnetic field applied to a left side and a right side of the bridge circuit into a differential output voltage. Assuming an ideal xMR sensor, the output voltage is linearly proportional to the differential magnetic field.

In particular, a resistive value of the one or more magnetic field sensor elements may change when exposed to a magnetic field. The resistive value, which corresponds to a characteristic of the magnetic field, may be measured such that information regarding the characteristic of the magnetic field is obtained. Further, the resistive value may be measured in the form of a voltage or current measurement. Thus, magnetic field sensor elements in an xMR sensor may be arranged in a bridge formation to provide a resistance value (e.g., in the form of a voltage output) corresponding to a measured characteristic of a magnetic field.

Magnetic field sensors provided herein may be configured for incremental speed measurement, angle measurement, position measurement, and rotation direction measurement of a rotating target object, such as a magnetic encoder (e.g., wheel), camshaft, or shaft. However, the embodiments are not limited thereto, and may apply to any device or system which uses magnetic sensors in a bridge configuration to generate a differential sensor (measurement) signal.

Figure 1A:
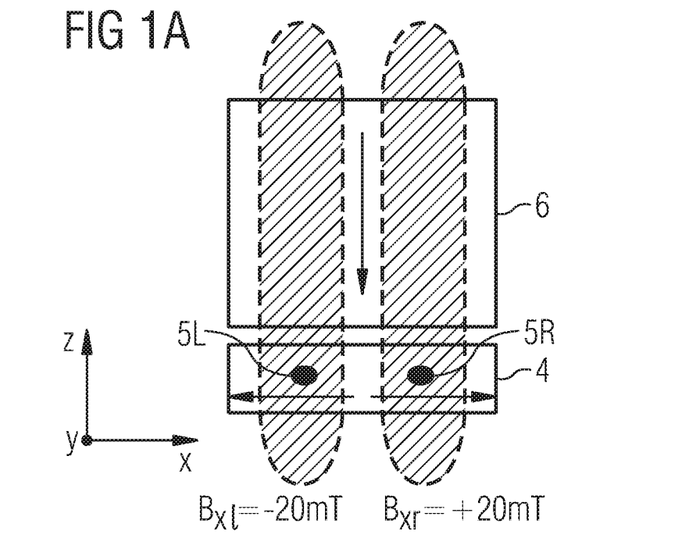
FIGS. 1A and 1B shows a cross-sectional view illustrating a magnetic field sensing principle according to one or more embodiments.
Figure 1B:
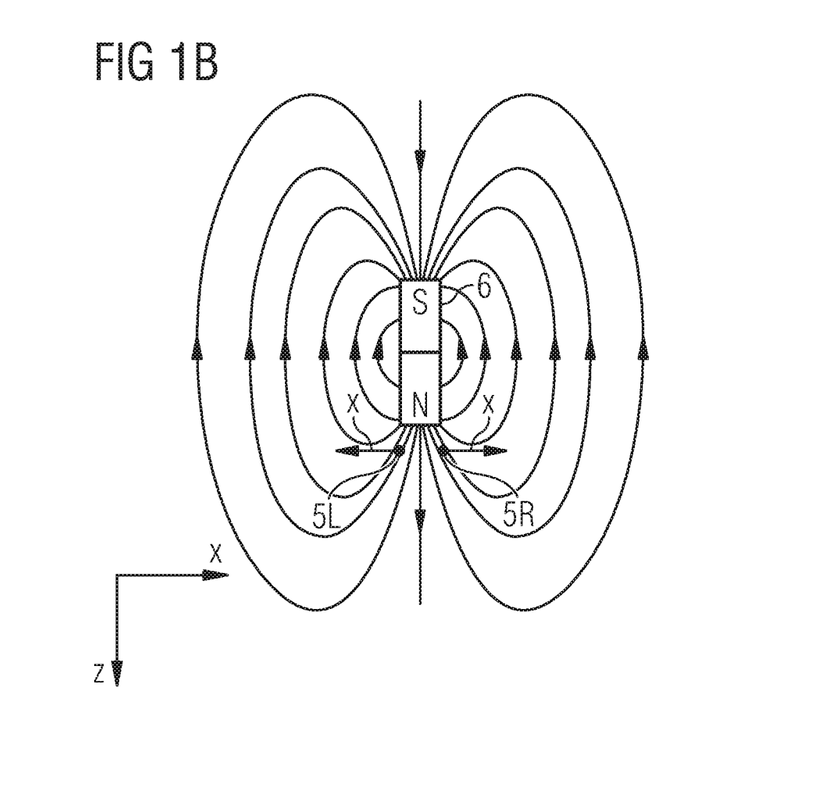

FIGS. 1A and 1B show a cross-sectional view illustrating a magnetic field sensing principle according to one or more embodiments. A sensor device 4, which may also be referred to as a sensor chip or a sensor circuit, may include two or more sensor elements disposed in a differential magnetic field produced by a magnet 6. The magnet 6 may be a standard low cost permanent magnet that generates a static magnetic field to the left side and the right side of the center of the magnet. This may also be referred to as a differential magnetic field, such that the amplitude of the magnetic field at the left side is equal to the amplitude of the magnetic field at the right side.

The magnet 6 generates a static magnetic field, as shown in FIG. 1B. If a sensor (e.g., sensor element 5L or 5R) is placed at a certain distance from the magnet 6, then a static magnetic field is present at the sensor position. This static magnetic field can be expressed by a component in the x- and y-direction as illustrated in FIG. 1B. For a magnetic sensing module (i.e., including the magnet 6 and the sensor device 4) the magnetic operation point (MOP) is defined as the measured field by the sensor in the absence of a target object, such as a wheel.

If two x-sensitive sensors are used with a certain displacement about the center of the magnet 6, then the MOP of the left sensor 5L and the right sensor 5R have a different sign. The differential field, also called differential MOP, is large. In the presence of a wheel the MOP of the sensor is influenced and depends on the angle of the wheel. The differential sensing module with a large MOP (x-sensitive sensors) generates a differential output signal around this MOP, i.e., with a large offset.

Thus, two sensor elements 5L and 5R are shown that are differentially displaced from each other such that one sensor element resides in half of the differential magnetic field, and the other sensor element resides in the other half of the differential magnetic field. The field amplitude of the differential magnetic field at the two locations is the same, but the sign of the magnetic field is opposite. In this example, an x-field component (Bxl) of the magnetic field at sensor element 5L is −20 mT, while the x-field component (Bxr) of the magnetic field at sensor element 5R is +20 mT. The differential field measured is 40 mT. It will be appreciated that field of 20 mT serves only as an example, and that the embodiments provided herein are not limited thereto. In addition, sensor elements 5L and 5R may be placed at locations where the field amplitude is different from each other (e.g., at −20 mT and −10 mT).

It will also be appreciated that sensor elements 5L and 5R may each represent a pair of sensor elements where a pair of sensor elements is arranged substantially at each location or region on the sensor chip. In this example, the sensor elements 5L and 5R may have opposing reference directions aligned along a same sensing axis (e.g., the x-axis). Thus, the sensor elements 5L and 5R are sensitive to an x-field component (Bx) produced by the magnet 6. Here, to sense an equivalent x-field component (Bx), sensor elements of a sensor pair may be aligned with each other in the y-direction. In addition, the reference directions are not limited to the above orientation and may be fixed in other orientations.

Figure 1C:
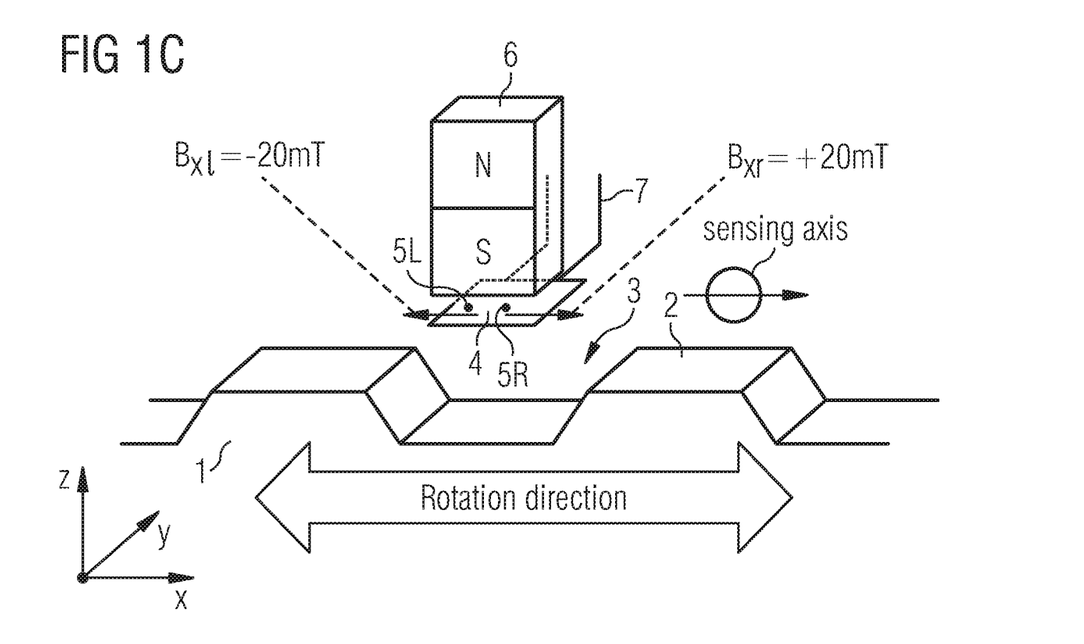
FIG. 1C illustrates a magnetic field sensing principle with a magnetic encoder according to one or more embodiments.

FIG. 1C illustrates a magnetic field sensing principle with a magnetic encoder according to one or more embodiments. One type of magnetic encoder may be a ferromagnetic encoder, which may be a toothed wheel or a toothed disc of ferromagnetic material with holes or notches that pass in front of the magnetic field sensor. Similar to that of FIG. 1A, a differential magnetic field may be produced by a back bias magnet 6 coupled to a backside of the magnetic field sensor. Thus, the magnetic field pattern of the magnetic field produced by the back bias magnet 6 may be altered by the passing of teeth 2 and notches 3 of the rotating magnetic encoder 1. Hence, the strength of the of the magnetic field produced by the back bias magnet 6 in certain sensing planes and sensing directions (e.g., x-, y-, and z-planes and directions) may be altered according to the change in the magnetic field pattern.

FIG. 1C shows a toothed wheel 1 that may rotate in either rotation direction and has alternating teeth 2 and notches 3, according to one or more embodiments. In particular, the toothed wheel 1 may be made of a ferromagnetic material (e.g., iron) that attracts magnetic fields. In addition, a sensor device 4 may include two pairs of sensor elements 5L and 5R that are arranged in a bridge configuration and are configured to sense a differential magnetic field produced by a back bias magnet 6. Together, the sensor device 4 and the back bias magnet 6 may comprise a sensor module. The sensor device 4 may generally be referred to herein as sensor 4, may further include a sensor circuit (not shown), and may be disposed in a sensor package.

As the toothed wheel 1 rotates, the teeth 2 and notches 3 alternate passing by the sensor module including the back bias magnet 6 and the pair of sensor elements 5L and 5R. In the instance of a tooth 2 passing the sensor module, the magnetic field lines of the bias magnetic field produced by the back bias magnet 6 are pulled in the z-direction towards the tooth 2. Thus, the magnetic field lines are pulled away from the x- and y-planes and a sensed magnetic field strength in the x- and y-directions is reduced such that a minimum field strength of Bx and By in the in the x- and y-directions would be detected at the center of the tooth 2. In contrast, a sensed magnetic field strength of Bz in the z-direction is increased such that a maximum field strength in the z-direction would be detected at the center of the tooth 2. This may differ in real-world applications where the minimum may not occur exactly at the center due to assembly tolerances, but the minimum field strength should be detected substantially at the center of the tooth 2.

Conversely, in the instance of a notch 3 passing the sensor module, magnetic field lines of the bias magnetic field produced by the back bias magnet 6 are not pulled (or are less pulled) in the z-direction towards the notch 3. Thus, the magnetic field lines remain concentrated relative to the x- and y-planes and the sensed magnetic field strength of Bx and By in the x- and y-directions would be at a maximum in the x- and y-directions at the center of the notch 3. In contrast, a sensed magnetic field strength in the z-direction is reduced such that a minimum field strength in the z-direction would be detected at the center of the notch 2. This may differ in real-world applications where the maximum may not occur exactly at the center, but the maximum field strength should be detected substantially at the center of the notch 3.

The two pairs of magnetic field sensor elements 5L and 5R in may be referred to as differential pairs of sensor elements that are configured to convert the differential magnetic field applied to the left side and the right side of the sensor device 4 into a differential output voltage (i.e., a differential signal). In such a differential bridge configuration, the sensor signals from each sensor element of the differential pair of sensor elements 5L and 5R may be provided within the sensor circuit (i.e., the bridge circuit) that is configured to generate a differential signal at the bridge output. Due to the bridge configuration, the differential signal may cancel out homogeneous and/or non-homogenous stray-fields in the sensing axis of the xMR sensor.

In addition, each differential pair of sensor elements 5L and 5R may be disposed from a center of the magnetic field at a distance of about half of a pitch of wheel 1 in order to generate a differential signal with high signal to noise ratio. That is, the distance between the differential pair of sensor elements 5L and 5R, both being spaced about half a pitch from center, may be matched or substantially matched (e.g., within 5% to allow for manufacturing tolerances) to the pitch of the wheel 1. A pitch is the distance along a pitch circle between two adjacent teeth of a toothed wheel. However, it will be appreciated that other spacing arrangements are also possible and used especially if the wheel is used to transmit mechanical forces. Lastly, leads 7 provide an electrical pathway for various input and output signals (e.g., power, command and output signals) to and from the sensor device 4.

Referring to the configuration shown in FIG. 1C as an example, as the wheel 1 rotates, the teeth 2 and notches 3 alternate past the sensor module and the differential pair of sensor elements (or the four resistors within a Wheatstone bridge configuration) 5L and 5R sense a change in the x-axis magnetic field strength Bx that varies as a sinusoidal-like waveform (i.e., as a signal modulation), the frequency of which corresponds to a speed of rotation of the wheel 1. Thus, the sensor circuit of the sensor device 4 receives signals (i.e., sensor signals) from each sensor element of the differential pairs of sensor elements 5L and 5R and derives, from the sensor signals, a differential signal that represents the magnetic field as a signal modulation. The differential signal may then be output as an output signal to an external controller, control unit or processor (e.g., an electronic control unit (ECU)), or used internally by the sensor circuit for further processing (e.g., to generate a pulsed output signal) before being output to an external device. For example, the external device may count the pulses of the pulsed output signal and calculate a wheel-speed therefrom.

Alternatively, the differential signal may represent an angle measurement, a position measurement, or a rotation direction measurement according to the implementation of the sensor device 4 and its target object. Furthermore, additional differential pair of sensor elements may be provided and configured to generate any type of differential signal representative of a differential magnetic field, including those types of measurements signals provided herein. Also, two or more sets of differential pairs of sensor elements may be used in combination, each configured to generate a differential signal such that additional information related to the target object can be obtained. For example, a differential speed signal may be used in combination with a differential direction signal in a speed sensor.

In this arrangement, the two differential sensors may be placed with a certain distance to each other. As another example, a differential x-angle sensor signal may be used in combination with a differential y-angle sensor signal in an angle sensor.

Figure 2:
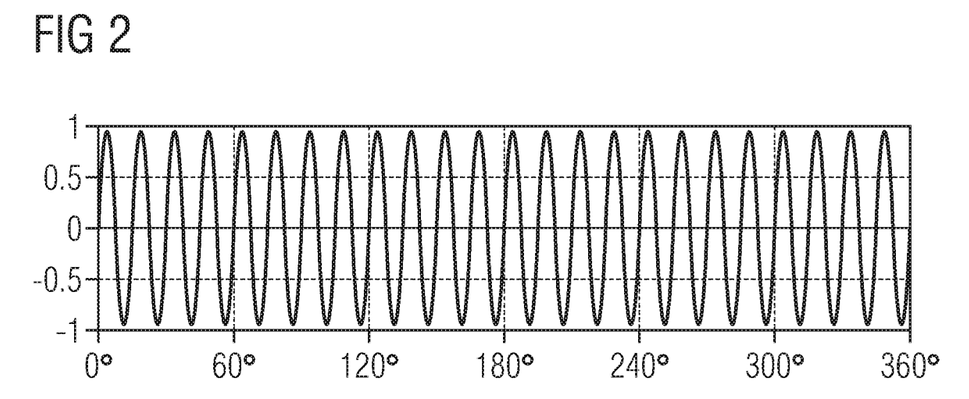
FIG. 2 is an example of a normalized sinusoidal waveform generated by a sensor arrangement of a magnetic speed sensor.

FIG. 2 is an example of a normalized sinusoidal waveform generated by the sensors of the sensor device 4 of a magnetic speed sensor. In particular, FIG. 2 shows a full revolution speed sensor signal response of one full revolution of an encoder wheel discussed above in FIG. 1C. However, the signal shape—especially on smaller airgaps—is different and depends on the shape of the teeth of the wheel.

A pole pair includes an adjacent tooth and notch on a toothed wheel. Typically, for speed applications, a number of teeth on a tooth wheel, translates into a number of sine waveforms for a full revolution of 360°. For this example, the encoder wheel 1 would include 24 pole pairs according to the sinusoidal waveform shown in FIG. 2.

As can be seen from the waveform, an output signal based on a sensed magnetic field that oscillates between two extrema (e.g., a minimum and a maximum) in accordance with the rotation of the encoder wheel. A processor may be configured to calculate a wheel-speed and rotation direction of the rotating encoder wheel 1 based on the output signals generated by the sensors.

Figure 3:
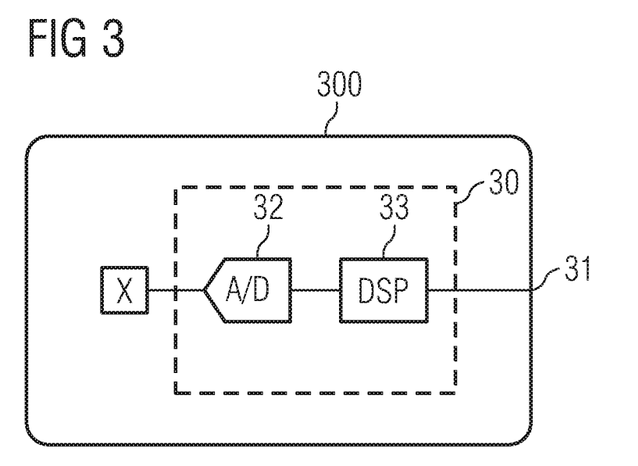
FIG. 3 is a schematic block diagram illustrating a magnetic speed sensor according to one or more embodiments.

FIG. 3 is a schematic block diagram illustrating a magnetic speed sensor 300 according to one or more embodiments. The magnetic speed sensor 300 includes sensor arrangement X that is configured to generate a differential sensor signal in response to a magnetic field impinging thereon. In particular, sensor arrangement X may represent a resistor bridge that includes two differential pairs of sensor elements arranged in a bridge configuration.

The magnetic speed sensor 300 also includes a sensor circuit 30 that receives the differential sensor signal from the sensor arrangement X for processing and for generation of pulsed output speed signal at output 31. In particular, the differential sensor signal may be received by an ADC 32 that converts the analog signal into a digital signal, and outputs the digital signal to a DSP 33 for further processing.

The digital signal processor 33 may include one or more processors and/or logic units that performs various signal conditioning functions, such as absolute signal conversion, normalization, linearization, frequency increase, and so forth. One or more signal conditioning functions may be performed in combination with a lookup table stored in memory. The output 31 of the digital signal processor 33 may provide one or more output signals to an external device, such as an ECU. The digital signal processor 33 may also be implemented as digital logic.

For example, the speed of rotation of the target object may be output as a speed pulse signal. Thus, the sinusoidal signal generated by the sensor arrangement X may be translated by the digital signal processor 33 into pulses, which may be further translated into a movement detection or a speed output. In addition, the digital signal processor 33 may receive two or more differential sensor signals from different sets of differential pairs of sensor elements for determining additional information related to the target object.

Figure 4:
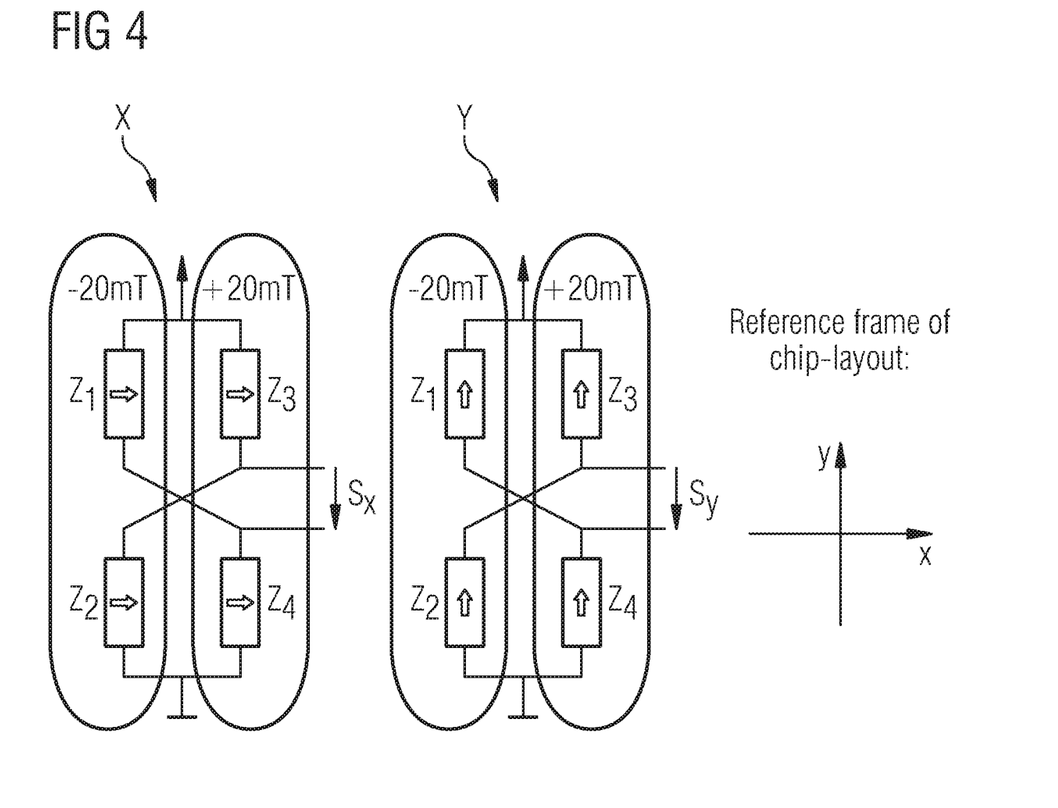
FIG. 4 is a schematic diagram illustrating two example sensor bridge configurations using four xMR sensor elements according to one or more embodiments.

FIG. 4 is a schematic diagram illustrating two possible sensor bridge configurations using four xMR sensor elements. For example, FIG. 4 illustrates an example of a magnetic sensor bridge circuit X that generates a differential sensor signal Sx and includes four xMR sensor elements Z1, Z2, Z3, and Z4 with arrows provided to denote a direction of a pinned-layer magnetization of each sensor element aligned in the x-direction. In this case, it can be said that the magnetic sensor has an x-sensing axis. The sensor is coupled to a magnet that produces a static magnetic field and that has an MOP of 20 mT.

Sensor elements Z1 and Z2 make up a first pair of sensor elements that are disposed in a region exposed to a first portion of a differential magnetic field having a field strength of −20 mT. Similarly, sensor elements Z3 and Z4 make up a second pair of sensor elements that are disposed in a region exposed to a second portion of the differential magnetic field having a field strength of +20 mT. The first portion and the second portion of the differential magnetic field have opposite magnitudes. In addition, sensor element pairs may be placed at locations where the field amplitude is different from each other (e.g., at −20 mT and −10 mT).

A first leg of the magnetic sensor bridge circuit X comprises a first magnetoresistive sensor element Z1 and a fourth magnetoresistive sensor element Z4. The first and the fourth magnetoresistive sensor elements Z1 and Z4 are connected in series. Furthermore, a second leg of the magnetic sensor bridge circuit X comprises a second magnetoresistive sensor element Z2 and a third magnetoresistive sensor element Z3. The third and the second magnetoresistive sensor elements Z3 and Z2 are connected in series. The first and the third magnetoresistive sensor elements Z1 and Z3 are connected to a first supply terminal of the magnetic sensor bridge circuit X. The second and the fourth magnetoresistive sensor elements Z2 and Z4 are connected to a second, different supply terminal of the magnetic sensor bridge circuit X. It will be appreciated that the specific directions of each pinned-layer magnetization, as shown, may be rotated by 180° as a matter of design.

The differential sensor signal Sx is a function of the magnetic field measured at the two locations where the two pairs of sensor elements are provided. As will be described in more detail below, the magnetic sensor bridge circuit X has an asymmetric configuration where the conductance or the resistance on the left side and the right side of the bridge are not equal to each other. In this case, the conductance or resistance of each sensor element is configured such that the differential sensor signal Sx is zero when a differential magnetic field at the magnetic sensor bridge circuit X equals its MOP field strength.

FIG. 4 further illustrates an example of a magnetic sensor bridge circuit Y that generates a differential sensor signal Sy and includes four xMZ sensor elements Z1, Z2, Z3, and Z4 with arrows provided to denote a direction of a pinned-layer magnetization of each sensor element aligned in the y-direction. In this case, it can be said that the magnetic speed sensor 500 has a y-sensing axis.

A first leg of the magnetic sensor bridge circuit Y comprises a first magnetoresistive sensor element Z1 and a fourth magnetoresistive sensor element Z4. The first and the fourth magnetoresistive sensor elements Z1 and Z4 are connected in series. Furthermore, a second leg of the magnetic sensor bridge circuit Y comprises a third magnetoresistive sensor element Z3 and a second magnetoresistive sensor element Z2. The second and the third magnetoresistive sensor elements Z2 and Z3 are connected in series. The first and the third magnetoresistive sensor elements Z1 and Z3 are connected to a first supply terminal of the magnetic sensor bridge circuit Y. The second and the fourth magnetoresistive sensor elements Z2 and Z4 are connected to a second, different supply terminal of the magnetic sensor bridge circuit Y. It will be appreciated that the specific directions of each pinned-layer magnetization, as shown, may be rotated by 180° as a matter of design.

The differential sensor signal Sy is a function of the magnetic field measured at the two locations where the two pairs of sensor elements are provided. In this example, with Y-sensitive sensors, the MOP of the left and right side of the bridge equal to each other (e.g., +20 mT). The differential output Sy is zero.

Figure 5A:
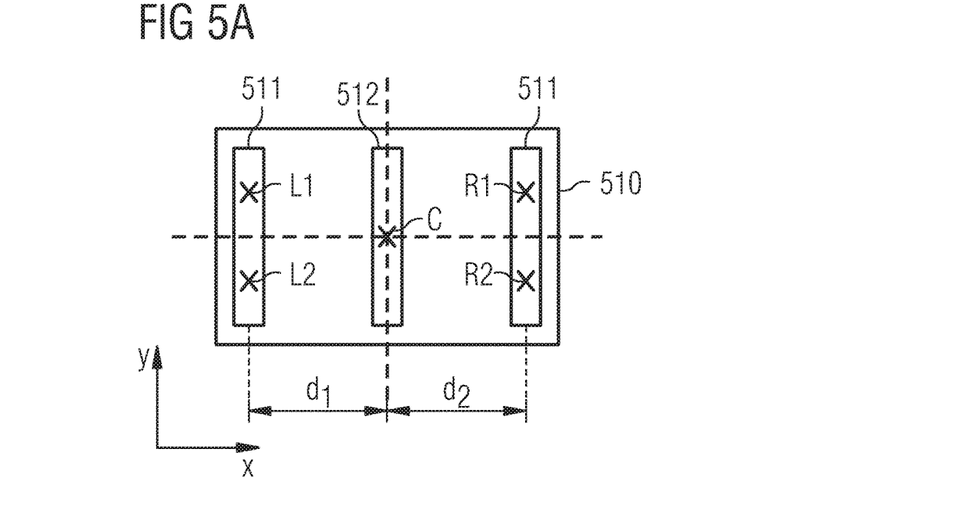
FIGS. 5A-5C show plan views of different example sensor arrangement configurations of a magnetic sensor according to one or more embodiments.
Figure 5B:
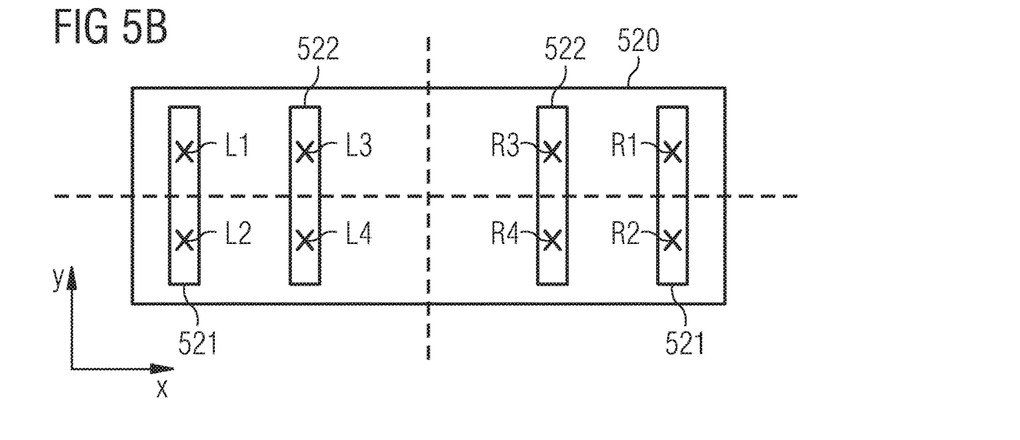
Figure 5C:
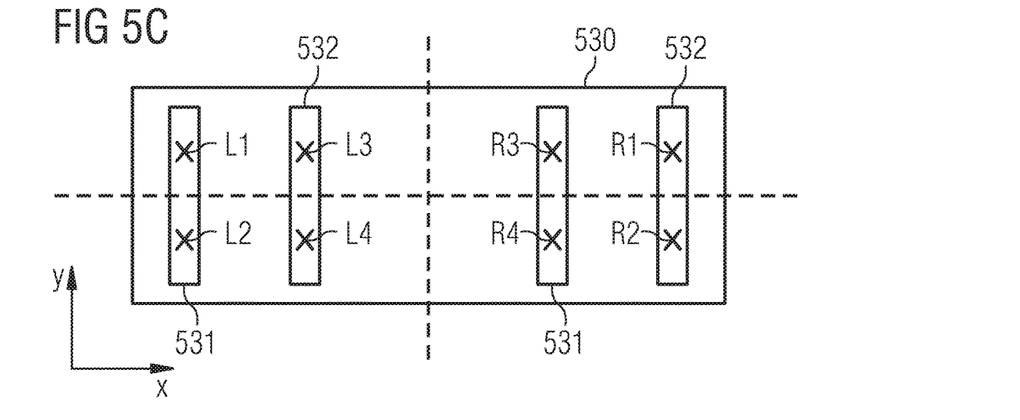

FIGS. 5A-5C show plan views of different example sensor arrangement configurations of a magnetic sensor according to one or more embodiments. In particular, FIG. 5A shows a chip-layout of a magnetic sensor 510, FIG. 5B shows a chip-layout of a magnetic sensor 520, and FIG. 5C shows a chip-layout of a magnetic sensor 530. Each chip-layout is shown in an x-y plane and includes at least one sensor arrangement having an asymmetric bridge configuration.

According to FIG. 5A, the magnetic sensor 510 includes a first sensor arrangement 511 and a second sensor arrangement 512. The first sensor arrangement 511 includes a first pair of sensor elements, including sensor elements L1 and L2, arranged in a left region (i.e., a left side) of the magnetic sensor 510 and a second pair of sensor elements, including sensor elements R1 and R2, arranged in a right region (i.e., a right side) of the magnetic sensor 510. The first pair of sensor elements L1, L2 and the second pair of sensor elements R1, R2 may be equally spaced from a center of the magnetic sensor 510, which may also coincide with a center of a back bias magnet. Therefore, distance d1 may equal distance d2.

The sensor elements L1, L2, R1, and R2 may be arranged in a bridge circuit according to one of the examples shown in FIG. 4, and may have corresponding positions and reference directions similar to those of the resistive elements Z1, Z2, Z3, and Z4, respectively.

The second sensor arrangement 512 may include a mono-cell sensor element C. Thus, in a speed sensor application, for example, the first sensor arrangement 511 may be configured to generate a differential speed signal, and the second sensor arrangement 512 may be configured to generate a direction signal.

According to FIG. 5B, the magnetic sensor 520 includes a first sensor arrangement 521 and a second sensor arrangement 522. The first sensor arrangement 521 includes a first pair of sensor elements, including sensor elements L1 and L2, arranged in a first left region (e.g., a left edge) of the magnetic sensor 520 and a second pair of sensor elements, including sensor elements R1 and R2, arranged in a first right region (e.g., a right edge) of the magnetic sensor 520. The first pair of sensor elements L1, L2 and the second pair of sensor elements R1, R2 may be equally spaced from a center of the magnetic sensor 520, which may coincide with a center of a back bias magnet.

The sensor elements L1, L2, R1, and R2 may be arranged in a bridge circuit according to one of the examples shown in FIG. 4, and may have corresponding positions and reference directions similar to those of the resistive elements Z1, Z2, Z3, and Z4, respectively.

The second sensor arrangement 522 includes a third pair of sensor elements, including sensor elements L3 and L4, that may be arranged in a second left region (e.g., a left center) of the magnetic sensor 520 and a fourth pair of sensor elements, including sensor elements R3 and R4, that may be arranged in a second right region (e.g., a right center) of the magnetic sensor 520. The third pair of sensor elements L3, L4 and the fourth pair of sensor elements R3, R4 may be equally or un-equally spaced from a center of the magnetic sensor 520, which may coincide with a center of a back bias magnet.

With this, a phase shift between output signals generated by the first sensor arrangement 521 and the second sensor arrangement 522 is produced and the wheel rotation direction can be detected. The sensor elements L3, L4, R3, and R4 may be arranged in a bridge circuit according to one of the examples shown in FIG. 4, and may have corresponding positions and reference directions similar to those of the resistive elements Z1, Z2, Z3, and Z4, respectively.

In a speed sensor application, for example, the first sensor arrangement 521 may be configured to generate a differential speed signal, and the second sensor arrangement 522 may be configured to generate a differential direction signal. With a phase shift between the sensor arrangements 521 and 522, the wheel direction can be determined.

According to FIG. 5C, the magnetic sensor 530 includes a first sensor arrangement 531 and a second sensor arrangement 532. The first sensor arrangement 531 includes a first pair of sensor elements, including sensor elements L1 and L2, arranged in a first left region (e.g., a left edge) of the magnetic sensor 520 and a second pair of sensor elements, including sensor elements R1 and R2, arranged in a first right region (e.g., a right center) of the magnetic sensor 520. The first pair of sensor elements L1, L2 and the second pair of sensor elements R1, R2 may be offset from a center of the magnetic sensor 530 with respect to each other. The center of the magnetic sensor 530 may coincide with a center of a back bias magnet.

The sensor elements L1, L2, R1, and R2 may be arranged in a bridge circuit according to one of the examples shown in FIG. 4, and may have corresponding positions and reference directions similar to those of the resistive elements Z1, Z2, Z3, and Z4, respectively.

The second sensor arrangement 532 includes a third pair of sensor elements, including sensor elements L3 and L4, arranged in a second left region (e.g., a left center) of the magnetic sensor 530 and a fourth pair of sensor elements, including sensor elements R3 and R4, arranged in a second right region (e.g., a right edge) of the magnetic sensor 520. The third pair of sensor elements L3, L4 and the fourth pair of sensor elements R3, R4 may be offset from a center of the magnetic sensor 530 with respect to each other. The center of the magnetic sensor 530 may coincide with a center of a back bias magnet.

The sensor elements L3, L4, R3, and R4 may be arranged in a bridge circuit according to one of the examples shown in FIG. 4, and may have corresponding positions and reference directions similar to those of the resistive elements Z1, Z2, Z3, and Z4, respectively.

In a speed sensor application, for example, the first sensor arrangement 531 may be configured to generate a differential speed signal, and the second sensor arrangement 532 may be configured to generate a differential direction signal.

Figure 6:
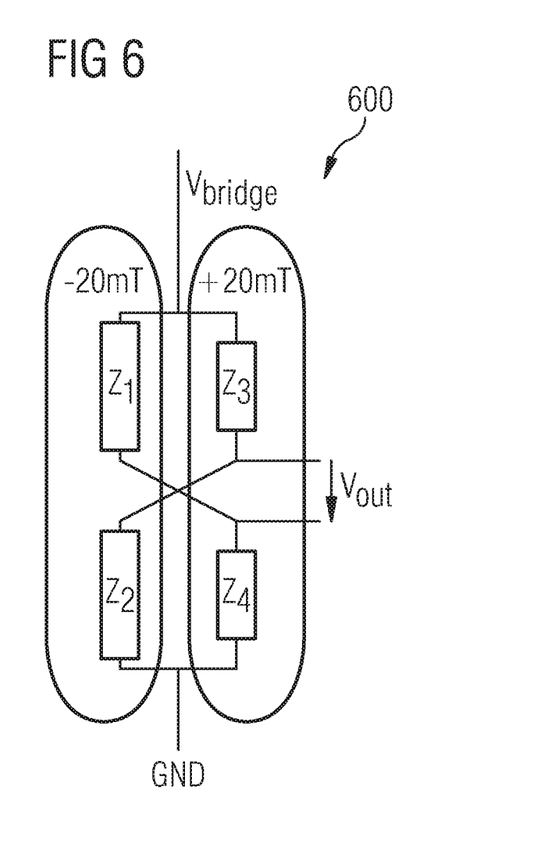
FIG. 6 shows a schematic diagram illustrating an asymmetric sensor bridge circuit according to one or more embodiments.

FIG. 6 shows a schematic diagram illustrating an asymmetric sensor bridge circuit 600 according to one or more embodiments. The asymmetric sensor bridge circuit includes sensor elements Z1, Z2, Z3, and Z4, as similarly arranged according to one of the examples shown in FIG. 4. In addition, the sensor elements Z1, Z2, Z3, and Z4 may be provided on a magnetic sensor according to any of the sensor arrangements shown in FIGS. 5A-5C. However, it will be appreciated that other sensor arrangements on a magnetic sensor are also possible, and are not limited thereto.

As can be observed, the sizes of the sensor elements Z1, Z2, Z3, and Z4 are exaggerated to illustrate the conductive or resistive asymmetry within the bridge circuit 600. For example, an electrical resistance of a pair of sensor elements on the left side of the asymmetric sensor bridge circuit 600

(i.e., Z1 and Z2) are not equal to an electrical resistance of a pair of sensor elements on the right side of the asymmetric sensor bridge circuit 600 (i.e., Z3 and Z4). In particular, sensor elements Z1 and Z2 may have a larger electrical resistance than the electrical resistance of sensor elements Z3 and Z4. Furthermore, the electrical resistance of sensor elements Z1 and Z2 may be equal or substantially equal (e.g., within 5% to allow for manufacturing tolerances), and, similarly, the electrical resistance of sensor elements Z3 and Z4 may be equal or substantially equal (e.g., within 5% to allow for manufacturing tolerances).

The difference in the resistance between the left side of the asymmetric sensor bridge circuit 600 and the right side of the asymmetric sensor bridge circuit 600 is equal to a variation on resistance caused by the MOP field strength of the back bias magnet (e.g., 20 mT). In particular, assuming the MOP is 20 mT, the conductance or resistance of the sensor elements Z1, Z2, Z3, and Z4 is configured such that, if no magnetic field is applied to the asymmetric sensor bridge circuit 600 (i.e., to the sensor elements Z1, Z2, Z3, and Z4), the differential output voltage (i.e., the differential sensor signal) may be −20 mV. Hence, the −20 mV, in the presence of no magnetic field, represents an electrical DC offset generated by the sensor bridge circuit 600 when coupled with a back bias magnet that has an MOP field strength of 20 mT.

As the magnetic field also varies over the airgap, the asymmetry of the bridge might also be set to compensate an MOP of 18 mT (and not 20 mT) and result in better offset stability over airgap.

If a differential magnetic field, with a field strength equal to the differential MOP field strength (e.g., +/−20 mT) is applied to the asymmetric sensor bridge circuit 600 (i.e., to the sensor elements Z1, Z2, Z3, and Z4), as discussed above, the differential output voltage (i.e., the differential sensor signal) is 0 mV. Thus, an imbalance caused by the differential MOP field strength is compensated by the electrical asymmetry of the bridge circuit 600. Due to this compensation, no offset cancellation DAC is required and may result is a reduction of chip area.

In a similar embodiment, the resistors Z2 and Z4 might have the same size and the magnetic imbalance is compensated by the imbalance of Z1 and Z3.

In a similar embodiment, the resistors Z2 and Z4 might be non-magnetic sensitive.

Further, while various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetic sensor, comprising:
a first sensor arrangement including a first plurality of magnetic field sensor elements electrically arranged in a first asymmetrical bridge circuit, wherein a first total resistance of a first pair of magnetic field sensor elements is different from a second total resistance of a second pair of magnetic field sensor elements,
wherein the first asymmetric bridge circuit includes a first leg and a second leg connected in parallel between a first supply terminal and a second supply terminal, wherein both the first leg and the second leg extend from the first supply terminal to the second supply terminal, wherein the first leg includes a first magnetic field sensor element of the first pair of magnetic field sensor elements and a first magnetic field sensor element of the second pair of magnetic field sensor elements, wherein the second leg includes a second magnetic field sensor element of the first pair of magnetic field sensor elements and a second magnetic field sensor element of the second pair of magnetic field sensor elements, and wherein the first asymmetrical bridge circuit is configured to generate a first differential signal based on sensor signals generated by the first plurality of magnetic field sensor elements in response to a magnetic field impinging thereon.

2. The magnetic sensor of claim 1, wherein:
resistance values of the first and the second magnetic field sensor elements of the first pair of magnetic field sensor elements are equal, and
resistance values of the first and the second magnetic field sensor elements of the second pair of magnetic field sensor elements are equal.

3. The magnetic sensor of claim 1, wherein:
resistance values of the first magnetic field sensor element of the first pair of magnetic field sensor elements and the first magnetic field sensor element of the second pair of magnetic field sensor elements are equal, and
resistance values of the second magnetic field sensor element of the first pair of magnetic field sensor elements and the second magnetic field sensor element of the second pair of magnetic field sensor elements are equal.

4. The magnetic sensor of claim 1, further comprising a monocell sensor arrangement comprising a monocell magnetic field sensor element arranged at a center position,
wherein the first pair of magnetic field sensor elements are laterally spaced from the center position by a lateral distance in a first lateral direction, and
wherein the second pair of magnetic field sensor elements are laterally spaced from the center position by the lateral distance in a second lateral direction that is opposite to the first lateral direction.

5. The magnetic sensor of claim 1, further comprising:
a second sensor arrangement including a second plurality of magnetic field sensor elements electrically arranged in a second asymmetrical bridge circuit, wherein a third total resistance of a third pair of magnetic field sensor elements is different from a fourth total resistance of a fourth pair of magnetic field sensor elements,
wherein the second asymmetric bridge circuit includes a third leg and a fourth leg connected in parallel between the first supply terminal and the second supply terminal, wherein both the third leg and the fourth leg extend from the first supply terminal to the second supply terminal,
wherein the third leg includes a first magnetic field sensor element of the third pair of magnetic field sensor elements and a first magnetic field sensor element of the fourth pair of magnetic field sensor elements, wherein the fourth leg includes a second magnetic field sensor element of the third pair of magnetic field sensor elements and a second magnetic field sensor element of the fourth pair of magnetic field sensor elements, and wherein the second asymmetrical bridge circuit is configured to generate a second differential signal based on sensor signals generated by the second plurality of magnetic field sensor elements in response to a magnetic field impinging thereon.

6. The magnetic sensor of claim 5, wherein the first pair and the second pair of magnetic field sensor elements are laterally spaced from a center position further than the third pair and the fourth pair of magnetic field sensor elements.

7. The magnetic sensor of claim 6, wherein:
the first pair of magnetic field sensor elements are laterally spaced from the center position by a first lateral distance in a first lateral direction,
the second pair of magnetic field sensor elements are laterally spaced from the center position by the first lateral distance in a second lateral direction that is opposite to the first lateral direction,
the third pair of magnetic field sensor elements are laterally spaced from the center position by a second lateral distance in the first lateral direction, and
the fourth pair of magnetic field sensor elements are laterally spaced from the center position by a third lateral distance in the second lateral direction.

8. The magnetic sensor of claim 7, wherein the second lateral distance and the third lateral distance are the same.

9. The magnetic sensor of claim 7, wherein the second lateral distance and the third lateral distance are different.

10. The magnetic sensor of claim 5, wherein the first pair and the fourth pair of magnetic field sensor elements are laterally spaced from a center position further than the second pair and the third pair of magnetic field sensor elements.

11. The magnetic sensor of claim 10, wherein:
the first pair of magnetic field sensor elements are laterally spaced from the center position by a first lateral distance in a first lateral direction,
the second pair of magnetic field sensor elements are laterally spaced from the center position by a second lateral distance in a second lateral direction that is opposite to the first lateral direction,
the third pair of magnetic field sensor elements are laterally spaced from the center position by a third lateral distance in the first lateral direction, and
the fourth pair of magnetic field sensor elements are laterally spaced from the center position by a fourth lateral distance in the second lateral direction.

12. The magnetic sensor of claim 11, wherein:
the first lateral distance and the fourth lateral distance are equal,
the second lateral distance and the third lateral distance are equal,
and the first lateral distance and the second lateral distance are different.

* * * * *